(12) United States Patent
Gutierrez

(10) Patent No.: US 7,087,496 B2
(45) Date of Patent: Aug. 8, 2006

(54) SEAL RING FOR INTEGRATED CIRCUITS

(75) Inventor: German Gutierrez, Carlsbad, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/064,203

(22) Filed: Feb. 23, 2005

(65) Prior Publication Data

US 2005/0146014 A1 Jul. 7, 2005

Related U.S. Application Data

(63) Continuation of application No. 09/650,275, filed on Aug. 29, 2000, now Pat. No. 6,879,023.

(60) Provisional application No. 60/191,341, filed on Mar. 22, 2000.

(51) Int. Cl.
*H01L 21/336* (2006.01)
(52) U.S. Cl. ...................................... 438/294; 438/115
(58) Field of Classification Search ................ 438/140, 438/248, 294, 318, 353, 404, 115; 257/659
See application file for complete search history.

(56) References Cited

U.S. PATENT DOCUMENTS

| | | | |
|---|---|---|---|
| 4,280,070 A | 7/1981 | Reese et al. | |
| 4,988,636 A | 1/1991 | Masleid et al. | |
| 5,072,287 A * | 12/1991 | Nakagawa et al. | 257/500 |
| 5,475,255 A * | 12/1995 | Joardar et al. | 257/547 |
| 5,491,358 A | 2/1996 | Miyata | |
| 5,652,459 A | 7/1997 | Chen | |
| 5,814,889 A | 9/1998 | Gaul | |
| 6,028,347 A | 2/2000 | Sauber et al. | |
| 6,171,118 B1 * | 1/2001 | Witkowski et al. | 439/142 |
| 6,351,011 B1 * | 2/2002 | Whitney et al. | 257/355 |
| 6,424,022 B1 | 7/2002 | Wu et al. | |
| 6,853,067 B1 * | 2/2005 | Cohn et al. | 257/704 |
| 6,924,166 B1 * | 8/2005 | Sassolini et al. | 438/51 |
| 6,943,063 B1 * | 9/2005 | Tsai et al. | 438/118 |
| 2005/0110119 A1 * | 5/2005 | Chen | 257/620 |

FOREIGN PATENT DOCUMENTS

JP 55-21110 2/1980

* cited by examiner

*Primary Examiner*—S. V. Clark
(74) *Attorney, Agent, or Firm*—Brake Hughes PLC

(57) ABSTRACT

The present invention is directed to a seal structure and a method for forming a seal structure for a semiconductor die. An elongate region which is electrically isolated from the remainder of the substrate, such as a well region of a conductivity type opposite that of the substrate, extends around the major portion of the periphery of the substrate. A gap is left between the two ends of the elongate region along the minor portion of the periphery of the substrate not covered by the elongate region. A conductive seal ring is formed around the periphery of the substrate at the elongate region and spans the gap between the ends of the elongate region. The substrate of the semiconductor die is only brought into electrical contact with the seal ring at the gap between the ends of the elongate region.

11 Claims, 3 Drawing Sheets

SEAL RING FOR INTEGRATED CIRCUITS

CROSS-REFERENCES TO RELATED APPLICATIONS

This application is a continuation of U.S. patent application Ser. No. 09/650,275 filed Aug. 29, 2000 now U.S. Pat. No. 6,879,023 which claims priority from U.S. Provisional Patent Application Ser. No. 60/191,341 filed Mar. 22, 2000, the disclosures of each of which are incorporated herein by reference.

BACKGROUND OF THE INVENTION

1. Field of the Invention

The present invention relates generally to the manufacture of integrated circuits and more particularly, to a seal structure for a semiconductor die that improves substrate isolation.

2. Description of the Prior Art

Most semiconductor integrated circuit manufacturers require a seal ring at the periphery of the semiconductor die. The seal ring circumscribes the periphery of the semiconductor die and is in contact with the die. The seal ring surrounds the bonding pads, which are typically disposed along the outer edges of the die. The seal ring creates a barrier to penetration of moisture, corrosive gasses, and chemicals.

A conventional seal ring is a multi-layer structure composed of alternating conducting and insulating layers. Through each of the insulating layers run multiple vias which provide electrical paths between adjacent metal layers. The lowest layer of metal in the seal structure makes electrical contact with the substrate, which can be either p-type or n-type. This structure ensures that no oxide path is presented to the edges of the semiconductor die after the semiconductor die has been diced (i.e., cut into individual dies from a wafer).

While this seal structure provides an effective barrier to undesirable environmental effects, it presents a problem that can be severe in certain circuit applications. Specifically, the seal ring creates a substrate short-circuit path all the way around the semiconductor die because multiple sections of the semiconductor die make electrical contact with the seal ring. In the case of mixed signal integrated circuits, which integrate both analog and digital circuits on the same substrate, circuit designers take careful measures to isolate the noisy portions of the substrate that include the digital circuitry from the section of the substrate that carries the noise sensitive analog circuitry. This is usually accomplished by placing substrate barriers and substrate islands around different parts of the circuitry in order to isolate the more noisy circuit areas of the substrate from other areas that are more noise sensitive.

Isolating different circuitry areas on the substrate is effective in terms of directly isolating various portions of the circuitry from each other, but it does not address the short-circuit path between different portions of the circuitry provided by the seal ring. The seal ring provides a very low resistance metal path between different areas of the circuitry around the periphery of the substrate. Providing this path on which noise can travel from noisy areas of circuitry to noise sensitive areas defeats the attempts made to directly isolate the noisy digital areas of the substrate from the more noise sensitive analog areas.

SUMMARY OF THE INVENTION

The present invention is directed to a seal structure and method for forming a seal structure for a semiconductor die. An elongate region that is electrically isolated from the remainder of the substrate, such as a well region of a conductivity type opposite that of the substrate, extends around the major portion of the periphery of the substrate. A gap is left between the two ends of the elongate region along the minor portion of the periphery of the substrate not covered by the elongate region. A conductive seal ring is formed around the periphery of the substrate at the elongate region and spans the gap between the ends of the elongate region. The substrate of the semiconductor die is only brought into electrical contact with the seal ring at the gap between the ends of the elongate region.

Allowing the substrate to electrically contact the seal ring only at a minor portion of the seal ring ensures that the short circuit between the seal ring and the substrate is limited to a small portion of the semiconductor die. Thus, the only low resistance electrical path between the substrate and the seal ring is confined to the small portion of the seal ring in electrical contact with the gap in the elongate region. With only one low resistance electrical path between the seal ring and the substrate, the seal ring no longer behaves as a conductive ring interconnecting all areas of the semiconductor die. The direct contact between the seal ring and the substrate at the gap is sufficient, however, to prevent the seal structure from accumulating charge while being manufactured. The location of the minor portion of the seal ring that contacts the substrate can be adjusted and optimized according to the specific circuit requirements.

For example, in some applications it might be desirable to place the portion of the seal ring that contacts the substrate near the noisy area, or vice versa.

As mentioned above, the substrate and the well region of the preferred embodiment are formed having opposite conductivity types. The present invention allows for the substrate to have either a p-type or n-type conductivity, and the elongate region may be a well having either an n-type or p-type conductivity, respectively. Forming a well region with a conductivity opposite that of the substrate of the semiconductor die, and bringing the majority of the seal ring into physical contact only with the well region, reduces the ability of the semiconductor to communicate electrical signals, more specifically noise, through the seal ring to noise sensitive areas of the semiconductor die, without diminishing the protective benefits of the seal ring during manufacture of the die and during use of the semiconductor.

Other embodiments that isolate the seal ring from all or most of the substrate are also possible. For example, instead of the elongate well region, a high quality dielectric may be placed under the seal ring to electrically isolate it from the substrate. In another embodiment, the seal ring is electrically isolated from the substrate along the entire periphery of the die, and a separate low resistance path is provided between the seal ring and a power supply node to avoid a floating seal ring.

The novel features that are characteristic of the invention, as to organization and method of operation, together with further objects and advantages thereof, will be better understood from the following description when considered in connection with the accompanying drawings in which a preferred embodiment of the invention is illustrated by way of example. It is to be expressly understood, however, that the drawings are for the purpose of illustration and description only and are not intended as a definition of the limits of the invention.

DESCRIPTION OF THE SPECIFIC EMBODIMENTS

Figure 1:
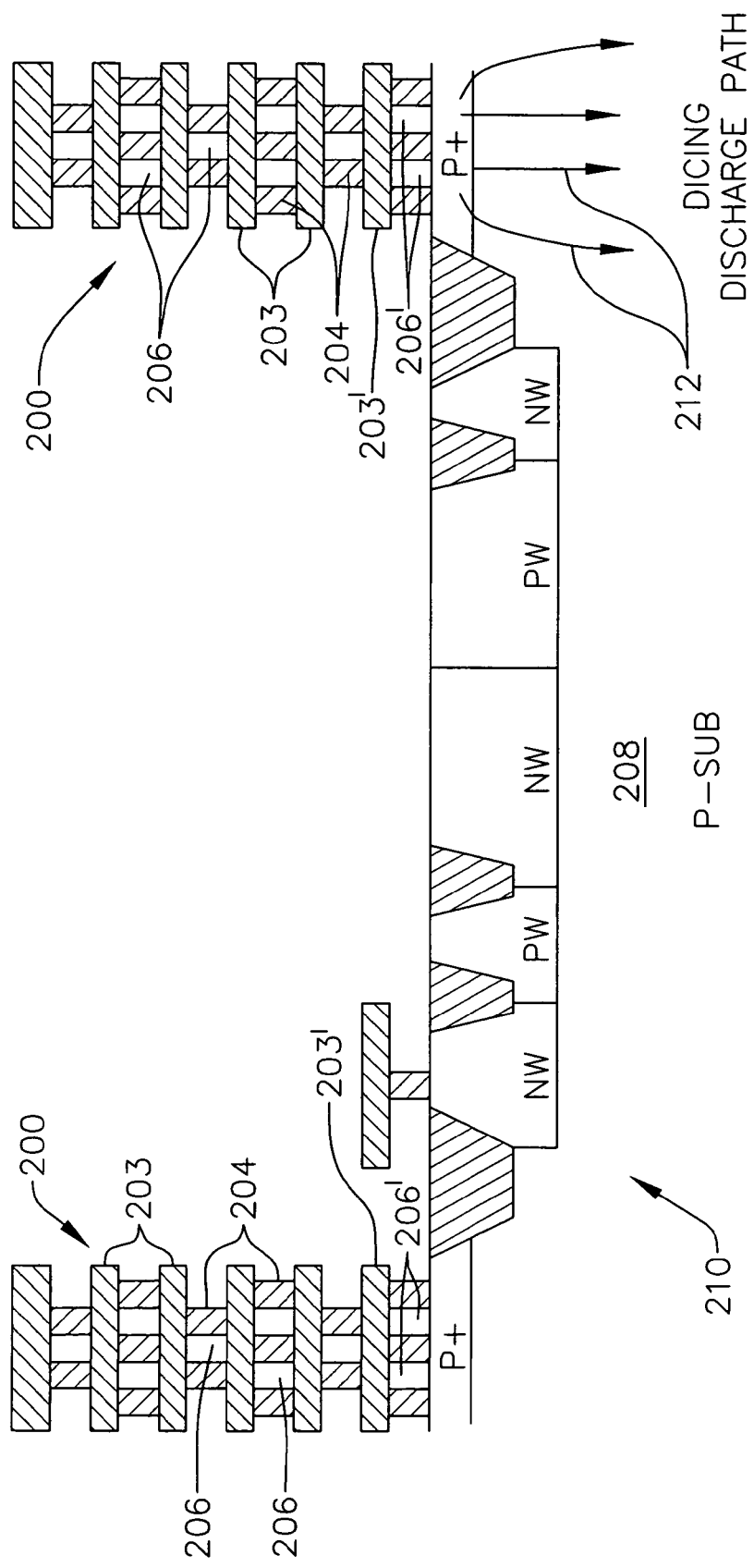
FIG. 1 is a schematic cross sectional view of a prior art seal ring and substrate.

A prior art semiconductor die 210 employing a seal ring structure 200 formed on a substrate 208 is illustrated by way of reference to FIG. 1. Seal ring 200 is composed of alternating conductive metal layers 203 and insulating layers 204. Each insulating layer 204 contains one or more vias 206 extending through the insulating layer and providing a conductive path between various metal layers 203. The lowest conductive metal layer 203' of seal 200 contacts substrate 208 through vias 206' to provide a relatively low resistance conductive path between the seal ring and the substrate of semiconductor die 210. Substrate 208 is typically silicon, but may consist of other materials.

FIG. 1 shows substrate 208 as having a p-type conductivity. Alternatively, substrate 208 could have an n-type conductivity. In either event, substrate 208 is rendered partially conducting. Dicing discharging paths 212 are created in substrate 208 at the point at which the lowest conductive metal layer 203' of seal ring 200 contacts the substrate. Dicing refers to the industry process of configuring a wafer into individual dies. Discharge paths 212 discharge charge in the substrate which has accumulated during manufacture of the semiconductor die.

Figure 2:
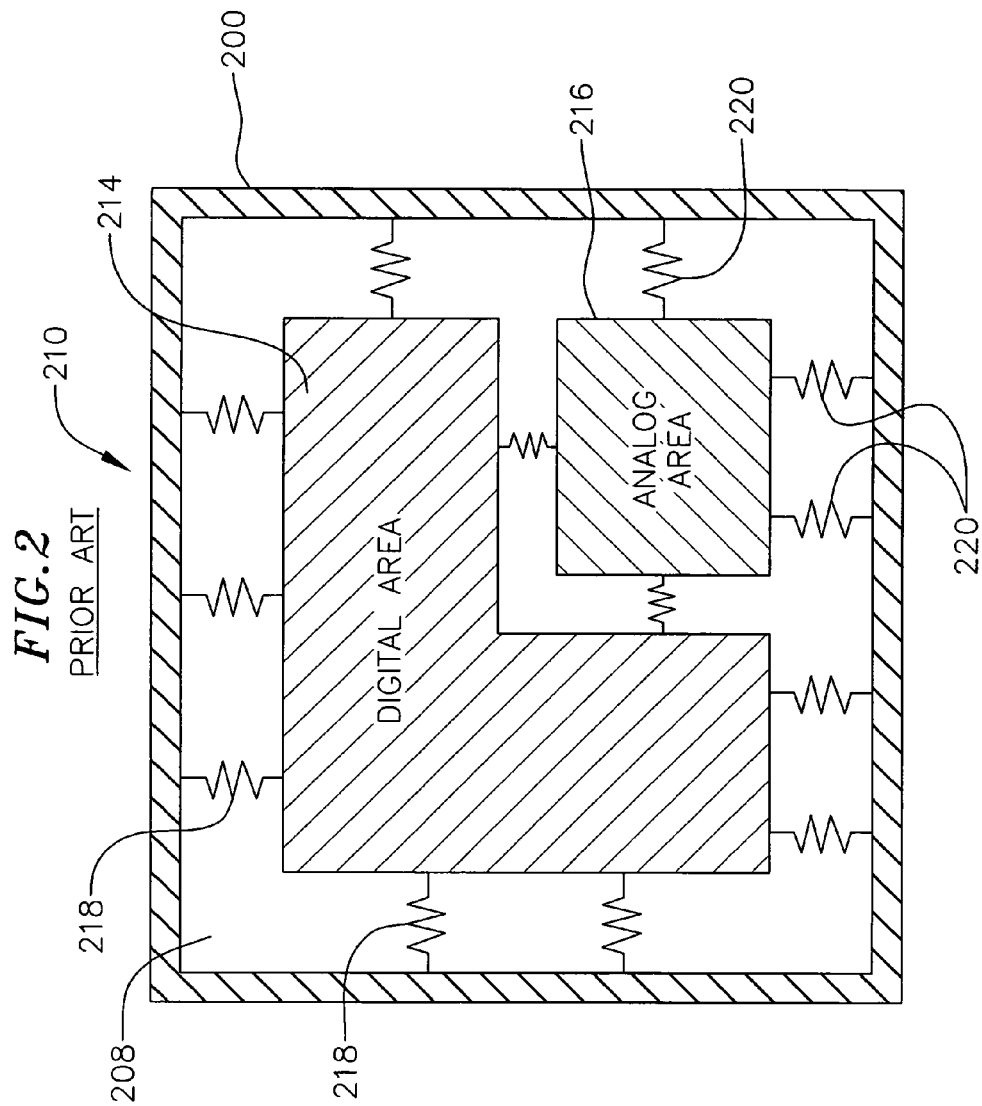
FIG. 2 is an overhead view of the prior art seal structure of FIG. 1.

As illustrated in FIG. 2, semiconductor die 210 has mixed signal integrated circuits, and two distinct circuit areas are located on substrate 208. Digital circuit area 214 contains a variety of digital circuits. Digital circuit area 214 is L shaped and occupies the majority of the area enclosed by seal 200. Analog circuit area 216 is also located on substrate 208 and contains a variety of analog circuits. Analog circuit area 216 is square and occupies the area enclosed by seal ring 200 not occupied by digital circuit area 214.

The digital circuits located in digital circuit area 214 characteristically create a relatively large amount of noise, to which the digital circuits themselves are not susceptible. The analog circuits in analog circuit area 216, however, are noise sensitive, i.e., they are prone to errors in the presence of noise. Digital circuit area 214 and analog circuit area 216 are prevented from transmitting noise directly to one another by substrate barriers or substrate islands (not shown) between the respective areas.

The region of the substrate 208 between the digital circuit area 214 and the conductive ring seal 200 provides partially conductive paths between the digital circuit area and the ring seal represented by resistor symbols 218. While the noise generated by the digital circuits is typically isolated so that it cannot directly reach the noise sensitive analog circuits in analog circuit area 216, such noise can reach conductive seal ring 200 through the conductive paths in the substrate represented by resistor symbols 218.

Analog circuit area 216 has a plurality of dicing discharging paths represented by resistors 220 between the analog circuit area and seal ring 200. These dicing discharging paths 220 allow the noise generated by the digital circuit area 214 and carried on conductive ring seal 200 to enter analog circuit area 216. This prior art implementation of the seal ring thus has the undesirable effect of transmitting noise from relatively high noise digital circuits to noise sensitive analog circuits in mixed signal integrated circuits.

Figure 3:
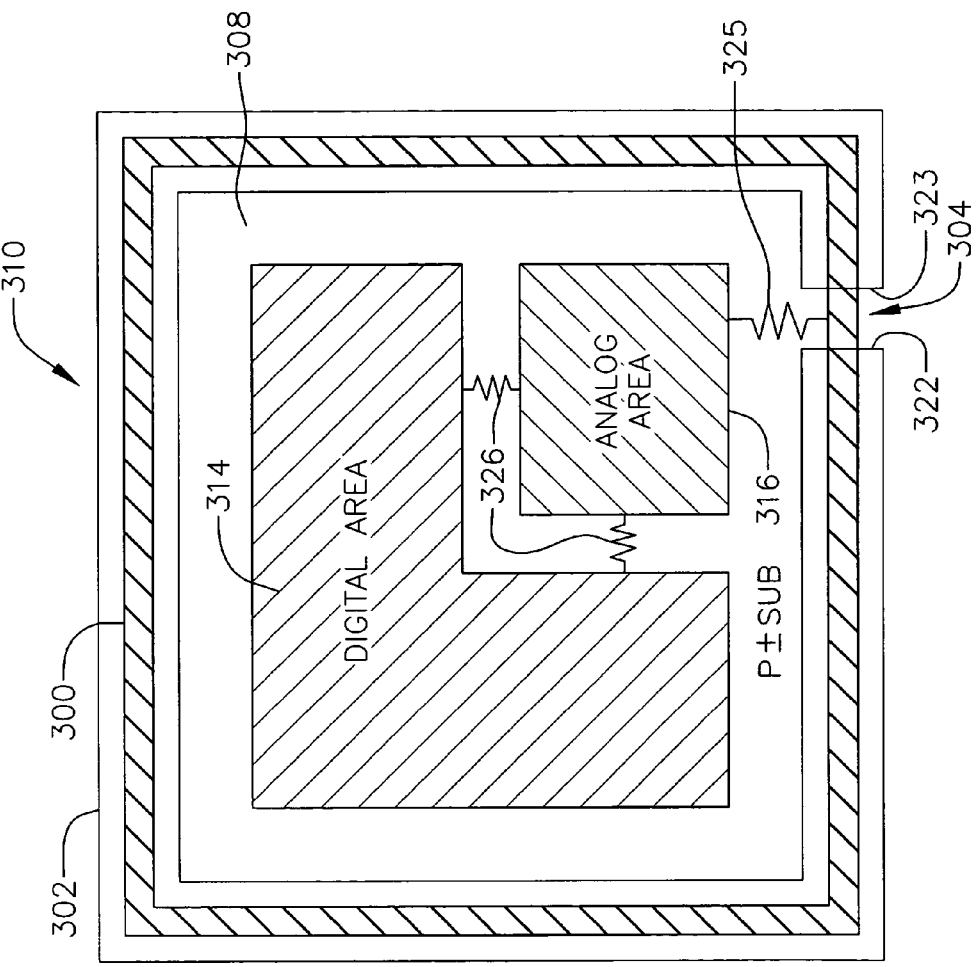
FIG. 3 is an overhead view depicting the preferred embodiments of the seal structure of the present invention.

FIG. 3 schematically illustrates a preferred embodiment of the semiconductor die 310 and seal ring 300 of the present invention. An elongate region 302 is formed in substrate 308 that extends around the majority of the periphery of semiconductor die 310. A gap 304 remains between the two ends 322, 323 of elongate region 302. In a preferred embodiment of the present invention, elongate region 302 constitutes an elongate well region having a conductivity type opposite from that of the substrate. If substrate 308 is p-type, the well region 302 is n-type, and vice versa. Alternatively, elongate region 302 may comprise a high quality dielectric layer that provides electrical insulation.

Seal ring 300 extends around the periphery of semiconductor die 310 and encompasses the digital circuit area 314 and the analog circuit area 316. The seal ring 300 of the preferred embodiment has the same structure as prior art seal ring 200 shown in FIG. 1. Seal ring 300 physically contacts the substrate along the entire length of elongate region 302. Seal ring 300 also physically contacts the substrate at the gap 304 between the ends 322, 323 of elongate region 302. Substrate 308 makes electrical contact with seal ring 302 solely at the gap 304 where the substrate physically contacts the seal ring without the intervening well region 302 of opposite conductivity type (or other insulator). A single partially conducting path illustrated by resistor 325 extends through substrate 308 to the section of seal ring 302 in electrical contact with the substrate at gap 304.

The electrical conductivity between the digital circuit area 314 and the analog circuit area 316 is highly restricted by barriers and islands in the substrate, as illustrated by small resistor symbols 326. Elongate region 302 restricts the electrical contact between seal ring 300 and the digital and analog circuit areas 314 and 316 except at the gap 304 in the elongate region. Nonetheless, seal ring 302 prevents substrate 308 from accumulating charge during the manufacturing and dicing of semiconductor die 310. Although seal ring 300 is electrically isolated by elongate region 302, seal ring 300 maintains its ability to protect the various circuit areas from the penetration of moisture, corrosive gasses, and chemicals that might be present in the environment.

In operation, the digital circuits in digital circuit area 314 will create noise, which does not inhibit the proper operation of the digital circuits themselves. Features in substrate 308 between the respective areas will effectively prevent the noise generated by the digital circuits from reaching the noise sensitive analog circuits in analog circuit area 316. Because electrical contact between substrate 308 and seal ring 300 is inhibited by elongate region 302 except at the gap 304 located far from digital circuit area 314, the seal ring 302 does not provide a short circuit to transmit such noise and little of the noise generated by the digital circuits will reach analog circuit area 316. Yet, the limited electrical contact between substrate 308 and seal ring 300 at gap 304 allows the seal ring to perform its discharge function.

While a preferred embodiment of the present invention has been illustrated in detail, it is apparent that modifications and adaptations of that embodiment will occur to those skilled in the art. For example, while elongate region 302 has been shown as a well region, the elongate region could be a high quality dielectric region or other insulative feature and a separate low resistive path provided between the seal ring and a power supply node to avoid a floating seal ring. Also, the gap between the ends of the elongate region can be near or far from the noisy circuit areas as needs require. However, it is to be expressly understood that such modifications and adaptations are within the spirit and scope of the present invention, as set forth in the following claims.

What is claimed is:

1. A method of sealing a semiconductor die having a substrate comprising:
    extending an elongate region around a major portion of the periphery of the substrate;
    forming a gap between ends of the elongate region along a minor portion of the periphery, the elongate region being of high resistivity from the remainder of the substrate except at the gap; and
    extending a passive conductive seal ring around the entire periphery of the die within the elongate region and in direct contact with the substrate only at the gap.

2. The method of claim 1, wherein the substrate has a first conductivity type, and wherein the elongate region comprises an elongate well region of a second conductivity type different from the conductivity of the first conductivity type.

3. The method of claim 2, wherein the first conductivity type is p-type and the second conductivity type is n-type.

4. The method of claim 2, wherein the first conductivity type is n-type and the second conductivity type is p-type.

5. The method of claim 1, wherein the elongate region comprises an elongate dielectric region between the passive conductive seal ring and the substrate.

6. The method of claim 1, wherein the substrate is formed of silicon.

7. The method of claim 1 wherein the passive conductive seal ring comprises a multilayer structure of alternating conducting and insulating layers, and wherein vias are formed in the insulating layers.

8. A method of die sealing for a semiconductor die having a substrate of a first conductivity type, comprising:
    forming an elongate well region of a second conductivity type opposite from the first conductivity type extending around a major portion of the periphery of the substrate and having a gap between the ends of the elongate region along a minor portion of the periphery, the elongate well region being of high resistivity from the remainder of the substrate except at the gap; and
    extending a passive conductive seal ring around the entire periphery of the die within the elongate well region and in direct contact with the substrate only at the gap.

9. The method of claim 8, wherein the first conductivity type is p-type and the second conductivity type is n-type.

10. The method of claim 8, wherein the first conductivity type is n-type and the second conductivity type is p-type.

11. The method of claim 8, wherein the passive conductive seal ring comprises a multilayer structure of alternating conducting and insulating layers, and wherein vias are formed in the insulating layers.

* * * * *